United States Patent [19]
Jang

[11] Patent Number: 5,901,110
[45] Date of Patent: May 4, 1999

[54] SYNCHRONOUS MEMORY WITH DUAL SENSING OUTPUT PATH EACH OF WHICH IS CONNECTED TO LATCH CIRCUIT

[75] Inventor: Seong Jun Jang, Kyoungki-do, Rep. of Korea

[73] Assignee: Hyundai Electronics Industries Co., Ltd., Ichon-shi, Rep. of Korea

[21] Appl. No.: 08/988,451

[22] Filed: Dec. 10, 1997

[30] Foreign Application Priority Data

Dec. 18, 1996 [KR] Rep. of Korea ........................ 96-67606

[51] Int. Cl.$^6$ ........................................................ G11C 7/00
[52] U.S. Cl. ........................... 365/233; 365/205; 365/207; 365/189.05
[58] Field of Search .................................... 365/205, 207, 365/208, 189.05, 233

[56] References Cited

U.S. PATENT DOCUMENTS 4,791,616  12/1988  Taguchi et al. ........................ 365/205
5,015,891  5/1991  Choi ........................................ 365/205
5,289,413  2/1994  Tsuchida et al. ................... 365/189.02
5,311,471  5/1994  Matsumoto et al. ..................... 365/208

*Primary Examiner*—Vu A. Le
*Attorney, Agent, or Firm*—Jacobson, Price, Holman & Stern, PLLC

[57] ABSTRACT

Disclosed is a synchronous memory device with a dual sensing output path having two data paths, each of which has a latch circuit and a sense amplifier. The synchronous memory device includes a first data reading means for amplifying and latching the data from memory cells in response to odd clock signals, a second data reading means coupled in parallel to the first data reading means for amplifying and latching the data from memory cells in response to the even clock signals, and a clock signal generating means for alternatively generating even clock signals and odd clock signals. According the second data reading means outputs to an output buffer the latched data therein while the second data reading means amplifies the data. As a result, the synchronous memory device according to the present invention may reduces the cycle time to read the cell data by up to 33%.

11 Claims, 4 Drawing Sheets

SYNCHRONOUS MEMORY WITH DUAL SENSING OUTPUT PATH EACH OF WHICH IS CONNECTED TO LATCH CIRCUIT

BACKGROUND OF THE INVENTION

1. Field of the Invention

The present invention relates to a memory device, and more particularly to a synchronous memory device with a dual sensing output path having two data paths, each of which has a latch circuit and a sense amplifier.

2. Description of Related Arts

In general, an output circuit on a read path of a synchronous memory controls the transmission of data read out from a memory cell. Accordingly, its performance depends on the increase of data transmission rate and a loss of data.

FIG. 1 is a schematic block diagram illustrating a read operation in a conventional synchronous memory device. As shown in FIG. 1, the conventional synchronous memory device has widely used an output register 20 controlled by an external clock K. The word line WL is activated and the a memory cell in a memory cell array 10 is selected. The data stored in the selected memory cell is transferred to a sense amplifier 14 through an Y-transfer gate 12. The data amplified by the sense amplifier 14 is stored in the latch circuit 16 which includes two inverters 17 and 19 and the latched data is input into the output register 20 controlled by the external clock K. When the clock K is in a high level, the data is transferred from the output register 20 to an output buffer 40.

Referring now to FIG. 2, if the word line is activated in response to the external clock K and address signals, the data stored in a selected memory cell is output to node N1 and the output data is amplified by the sense amplifier 14 and then the output from the sense amplifier 14 is transferred to node N2. The data at node N2 is transferred to the output buffer 40 via the output register 20.

However, if the output register operates before the output from the memory cell is transferred to the latch circuit through the sense amplifier, the output buffer can receive an erroneous data. Therefore, the external clock K is restricted in speed because the external clock K should not be applied the output register until the output from the sense amplifier is stored in the latch circuit. This restriction cause an problem not to make a cycle time of the memory device fast.

SUMMARY OF THE INVENTION

It is an abject of the prevent invention to provide a high-speed synchronous memory device using a parallel read path capable of reducing the latch time of cell data.

In accordance with an aspect of the present invention, there is provided a synchronous memory device comprising: 1) a plurality of memory cells storing data; 2) a clock signal generating means for alternatively generating even clock signals and odd clock signals; 3) a first data transferring means for transferring the data to an output buffer in response to the odd and even clock signals, the first data transferring means including: a) a first sense amplifier for amplifying the data; b) a first switching means for transferring the data to the first sense amplifier in response to the odd clock signals; c) a first latching mean for storing the amplified data; and d) a second switching means for transferring the latched data to the output buffer in response to the even clock signals; 4) a second data transferring means coupled in parallel to the first data transferring means for transferring the data to the output buffer in response to the odd and even clock signals, the second data transferring means including: e) a second sense amplifier for amplifying the data; f) a third switching means for transferring the data to the second sense amplifier in response to the even clock signals; g) a second latching mean for storing the amplified data; and h) a fourth switching means for transferring the latched data to the output buffer in response to the odd clock signal, whereby the fourth switching means outputs to the output buffer the data stored in the second latching means the data while the first sense amplifier amplifies the data and the amplified data is latched and also the second switching means outputs to the output buffer the data stored in the first latching means the data while the second sense amplifier amplifies the data and the amplified data is latched.

In accordance with another aspect of the present invention, there is provided a synchronous memory device, being synchronized with clock signals at a read operation, the synchronous memory device comprising: a plurality of memory cells storing data; a clock signal generating means for alternatively generating even clock signals and odd clock signals; a first data reading means for amplifying and latching the data from the memory cells in response to the odd clock signals; and a second data reading means coupled in parallel to the first data reading means for amplifying and latching the data from the memory cells in response to the even clock signals, whereby the second data reading means outputs to an output buffer the latched data therein while the second data reading means amplifies and latches the data, and also the first data reading means outputs to the output buffer the latched data therein while the first data reading means amplifies and latches the data.

BRIEF DESCRIPTION OF THE DRAWINGS

Other objects and aspects of the invention will become apparent from the following description of embodiments with reference to the accompanying drawings, in which.

DETAILED DESCRIPTION OF THE PREFERRED EMBODIMENTS

Hereinafter, the prevent invention will be described in detail referring FIGS. 3 and 4.

Figure 1:
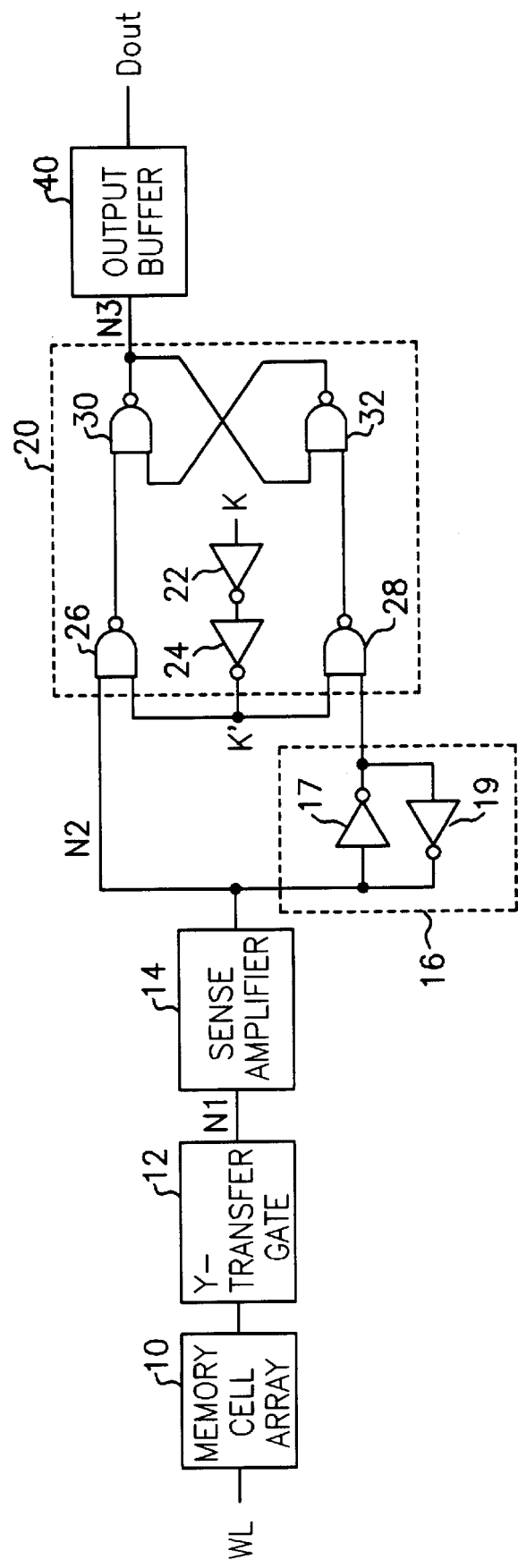
FIG. 1 is a schematic block diagram illustrating a read operation in a conventional synchronous memory device.
Figure 2:
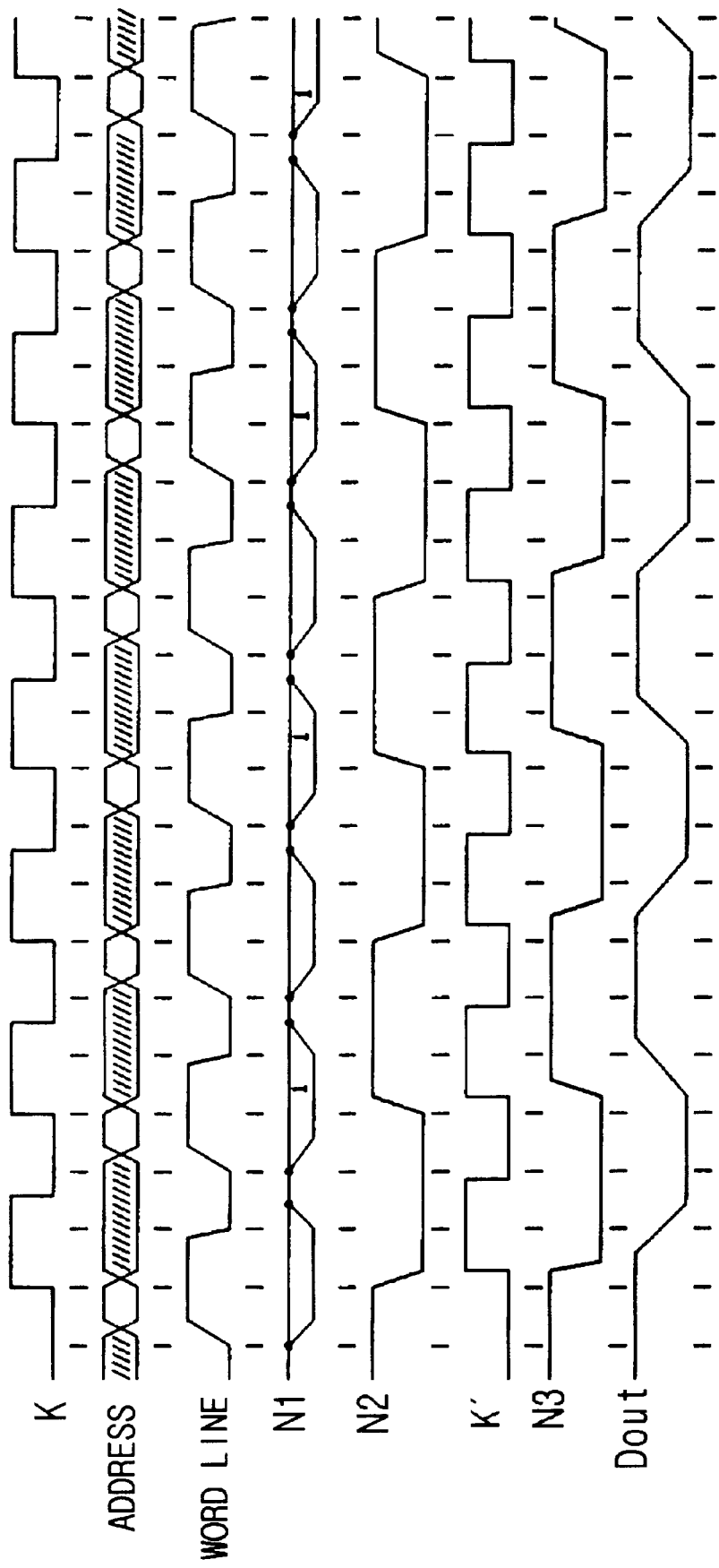
FIG. 2 is a timing diagram showing waveforms at nodes in FIG. 1.
Figure 3:
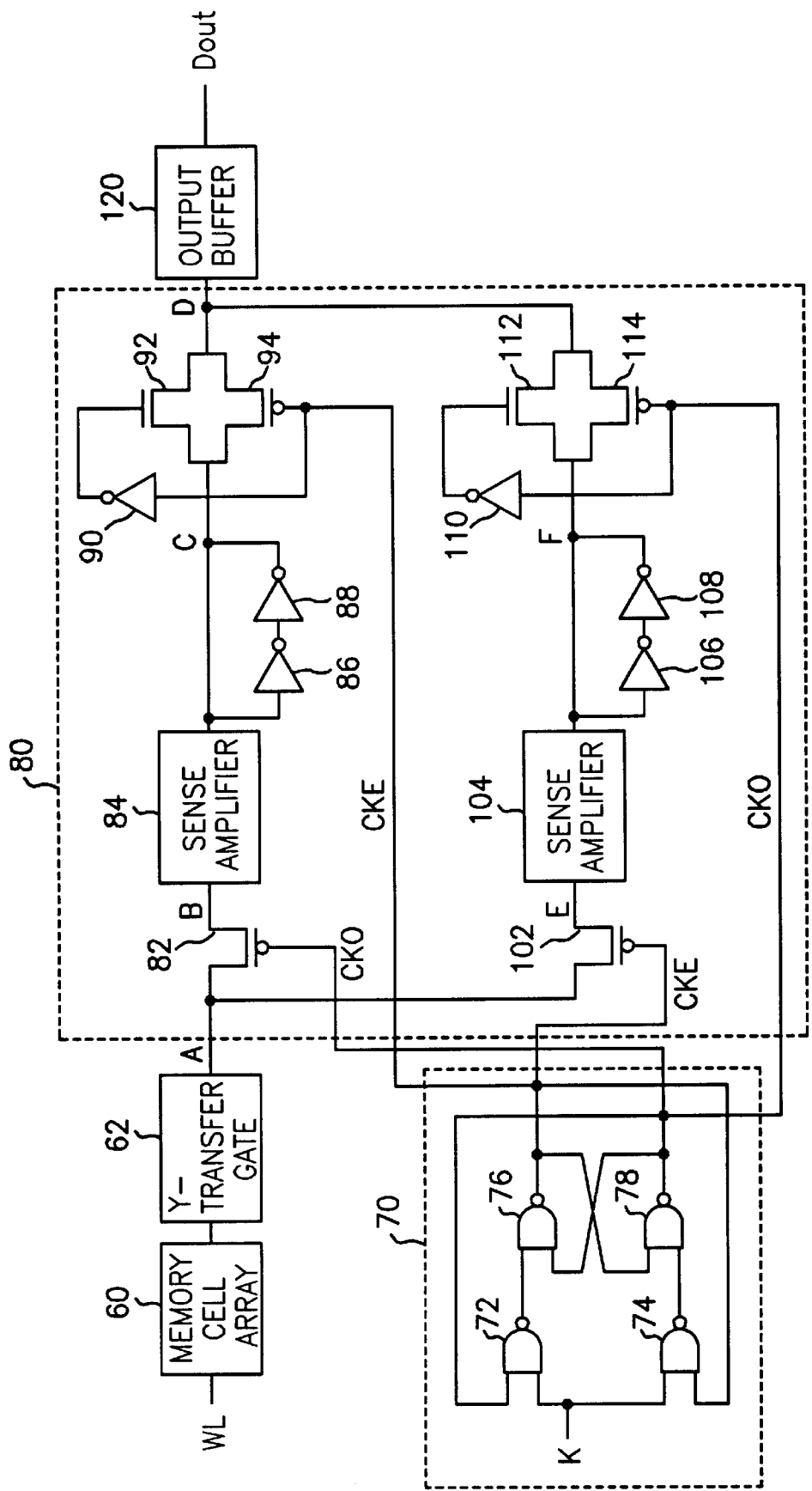
FIG. 3 is a schematic block diagram illustrating a read operation in a synchronous memory device according to the present invention.

First, FIG. 3 is a schematic block diagram illustrating a read operation in a synchronous memory device according to the present invention. As shown in FIG. 3, the synchronous memory device according to the present invention includes a clock generator 70, which consists of a toggle flip-flop, and a sensing output register 80. The sensing output register 80 has two paths for transferring data from a memory cell array 60 through an Y-transfer gate 62. That is, the sensing output register 80 has a first sensing output stage and a second output stage and also the first sensing output stage is coupled in parallel to the second output stage. The clock generator 70 receives an external clock signal K and generates even clock signals CKE and odd clock signals CKO which are used as control signals.

In the first sensing output stage, there is a first switch 82, which is turned on in response to the odd clock signals CKO, to electrically couple the Y-transfer gate 62 to a first sense amplifier 84. The amplifier 84 is coupled to a latch circuit 86 and 88 and the latch circuit 86 and 88 is coupled to a second switch coupled to an output buffer 120. Also, the second switch includes an NMOS transistor 92, a PMOS transistor 94 and an inverter 90. The PMOS transistor 94 is turned on in response to the even clock signals CKE. The inverter 90 provides the gate of the NMOS transistor 92 with the inverted even clock signals CKE.

Likewise, in the second sensing output stage, there is a third switch 102, which is turned on in response to the even clock signals CKE, to electrically couple the Y-transfer gate 62 to a second sense amplifier 104. The amplifier 104 is coupled to a latch circuit 106 and 108 and the latch circuit 106 and 108 is coupled to a fourth switch coupled to an output buffer 120. Also, the fourth switch includes an NMOS transistor 112, a PMOS transistor 114 and an inverter 110. The PMOS transistor 114 is turned on in response to the odd clock signals CKO. The inverter 110 provides the gate of the NMOS transistor 112 with the inverted odd clock signals CKO.

When the word line is activated, a specific memory cell is selected and the data stored in the selected memory cell is transferred to the Y-transfer gate 62. At this time, if the odd clock signal is produced by the clock generator 70, the data is amplified by the amplifier 84 in the first sensing output stage and the amplified data is stored in the latch circuit 86 and 88. All of the NMOS transistor 92 and the PMOS transistor 94 are turned on in response to the even clock signals generated in the next cycle and the data in the latch circuit 86 and 88 is transferred to the output buffer 120.

On the other hand, if the even clock signal is produced by the clock generator 70, the data is amplified by the amplifier 104. The amplified data is output into the latch circuit 106 and 108 while the previously latched data is transferred to the output buffer 120.

Figure 4:
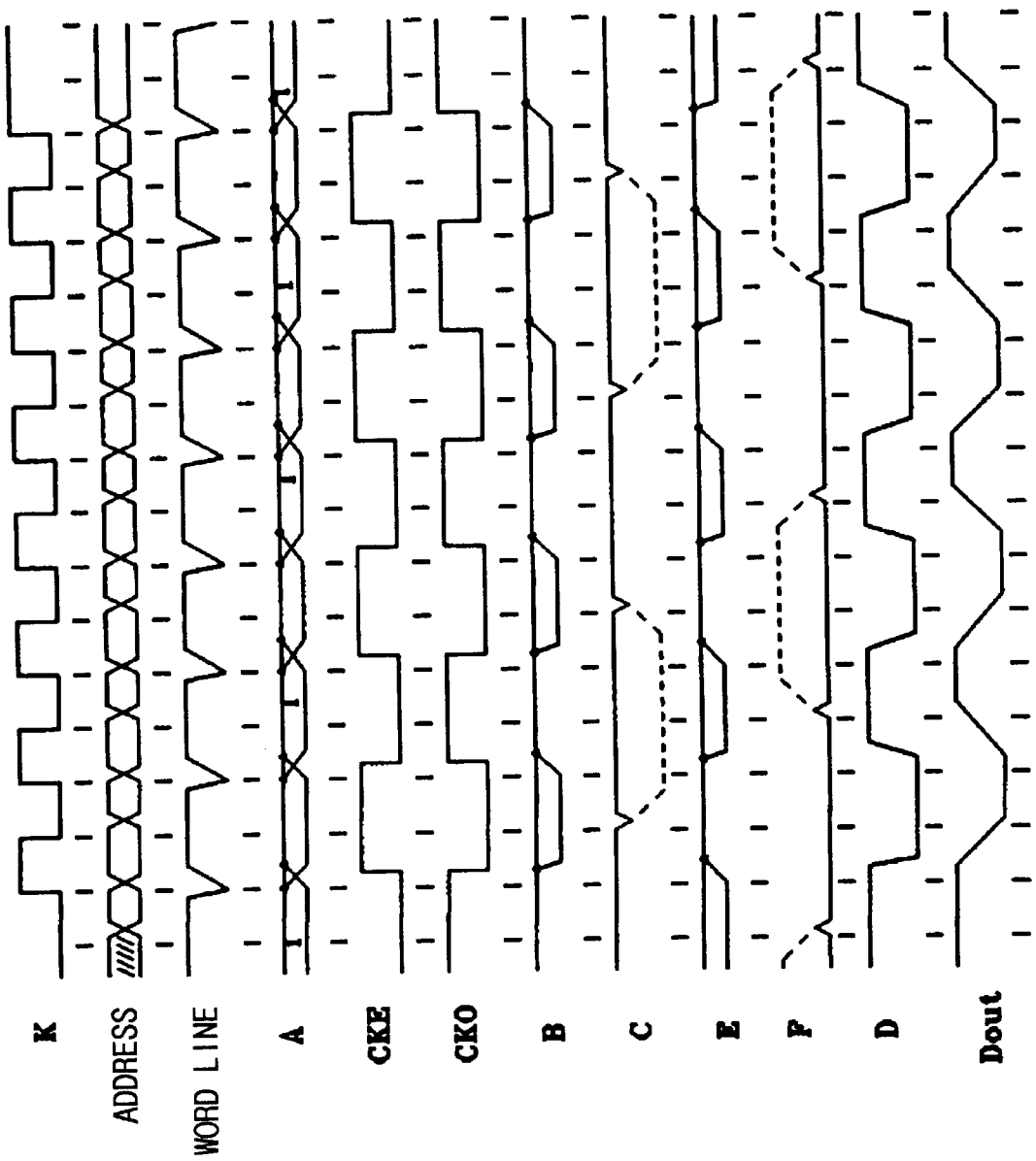
FIG. 4 is a timing diagram showing waveforms at nodes in FIG. 3.

FIG. 4 is a timing diagram showing waveforms at nodes in FIG. 3. As shown in FIG. 4, the odd clock signals CKO and the even clock signals CKE are generated by the clock generator 70 based on the synchronous clock signal K from the external circuit and address signals. The word line signals are generated on the basis of the address signals and the synchronous clock signal K so that the cell data of waveform A, as shown in FIG. 4, is generated at node A. When the even clock signal CKE is in a low state, the third switch 102 transfers the data to node E and the amplified data by the amplifier 104 is stored in node F.

If the odd clock signal CKO is in a low state, the data at node F is transferred to node D and then the data is transferred to the output buffer 120. At this time, while the even clock signal CKE is in a low state and the amplifier 104 operates, the sensing (amplified) data stored at node C in the previous cycle is output by the second switch (92 and 94) in response to the even clock signal.

By doing so, the read data is output by the second and fourth switches 92, 94, 112 and 114, being synchronized with the even and odd clock signal, respectively. Of course, to control the second and fourth switches, it may be possible to use other control signals instead of the odd and even clock signals from the clock generator 70 providing the control signals are synchronized with them.

As apparent from above, the synchronous memory according to the present invention may reduce the cycle time to read the cell data by up to 33%, by saving the latch time of the cell data from the amplifier.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A synchronous memory device having dual data transferring means, comprising:

1) a plurality of memory cells storing data;
2) a clock signal generating means for alternatively generating even clock signals and odd clock signals;
3) a first data transferring means for transferring the data to an output buffer in response to the odd and even clock signals, the first data transferring means including:
   a) a first sense amplifier for amplifying the data;
   b) a first switching means for transferring the data to the first sense amplifier in response to the odd clock signals;
   c) a first latching means for storing the amplified data; and
   d) a second switching means for transferring the latched data to the output buffer in response to the even clock signals;
4) a second data transferring means coupled in parallel to the first data transferring means for transferring the data to the output buffer in response to the odd and even clock signals, the second data transferring means including:
   e) a second sense amplifier for amplifying the data;
   f) a third switching means for transferring the data to the second sense amplifier in response to the even clock signals;
   g) a second latching means for storing the amplified data; and
   h) a fourth switching means for transferring the latched data to the output buffer in response to the odd clock signal, whereby the fourth switching means outputs to the output buffer the data stored in the second latching means the data while the first sense amplifier amplifies the data and the amplified data is latched and also the second switching means outputs to the output buffer the data stored in the first latching means the data while the second sense amplifier amplifies the data and the amplified data is latched.

2. The synchronous memory device in accordance with claim 1, wherein the clock signal generating means generates the odd and even clock signals form an external clock signal.

3. The synchronous memory device in accordance with claim 1, wherein the clock signal generating means is a toggle flip-flop.

4. A synchronous memory device having dual data reading means, being synchronized with clock signals at a read operation, the synchronous memory device comprising:

a plurality of memory cells storing data;
a clock signal generating means for alternatively generating even clock signals and odd clock signals;
a first data reading means for amplifying and latching the data from the memory cells in response to the odd clock signals; and
a second data reading means coupled in parallel to the first data reading means for amplifying and latching the data from the memory cells in response to the even clock signals,
whereby the second data reading means outputs to an output buffer the latched data therein while the second data reading means amplifies and latches the data, and also the first data reading means outputs to the output buffer the latched data therein while the first data reading means amplifies and latches the data.

5. The synchronous memory device in accordance with claim 4, wherein the first data reading means comprises a first switching means for transferring the data to a first sense amplifier in response to the odd clock signals.

6. The synchronous memory device in accordance with claim 5, wherein the second data reading means comprises a second switching means for transferring the data to a second sense amplifier in response to the even clock signals.

7. The synchronous memory device in accordance with claim 6, wherein the first data reading means comprises a first latching means, wherein the latched data by the first latching means is transferred to an output buffer in response to a first control signals.

8. The synchronous memory device in accordance with claim 7, wherein the second data reading means comprises a second latching means, wherein the latched data by the second latching means is transferred to the output buffer in response to a second control signals.

9. The synchronous memory device in accordance with claim 4, wherein the clock signal generating means is a toggle flip-flop.

10. The synchronous memory device in accordance with claim 7, wherein the first control signals is the even clock signals or is a signal which is synchronized with the even clock signals.

11. The synchronous memory device in accordance with claim 8, wherein the second control signals is the odd clock signals or is a signal which is synchronized with the odd clock signals.

* * * * *